United States Patent
Eliacin et al.

(10) Patent No.: US 6,859,119 B2
(45) Date of Patent: Feb. 22, 2005

(54) MESO-MICROELECTROMECHANICAL SYSTEM PACKAGE

(75) Inventors: Manes Eliacin, Buffalo Grove, IL (US); Tomasz Klosowiak, Glenview, IL (US); Robert Lempkowski, Elk Grove, IL (US); Ke Lian, Palatine, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/329,907

(22) Filed: Dec. 26, 2002

(65) Prior Publication Data
US 2004/0124957 A1 Jul. 1, 2004

(51) Int. Cl.⁷ ................................................ H01P 1/10
(52) U.S. Cl. .................................... 333/262; 200/181
(58) Field of Search ........................... 333/101, 103, 333/262; 200/181; 257/680; 369/116

(56) References Cited

U.S. PATENT DOCUMENTS 6,600,712 B1 * 7/2003 Masui et al. ............... 369/116
6,649,852 B2 * 11/2003 Chason et al. ............. 200/181
6,661,084 B1 * 12/2003 Peterson et al. ........... 257/680

* cited by examiner

Primary Examiner—Robert Pascal
Assistant Examiner—Dean Takaoka

(57) ABSTRACT

A mesoscale microelectromechanical system (MEMS) package for a micro-machine. The mesoscale micro-machine is formed on a printed circuit board (10) at the same time and of the same materials as the mesoscale micro-machine package. Both the micro-machine and the package have a first metal layer (12, 16), an insulating member (22, 26) formed on the first metal layer, and a second metal layer (32, 36) situated on the insulating layer. The package consists of a perimeter wall surrounding the micro-machine and a low-flow capping adhesive layer (40). The first metal layers of both the micro-machine and the package are formed in the same process sequence, and the insulating layers of both the micro-machine and the package are formed in the same process sequence, and the second metal layers of both the micro-machine and the package are formed in the same process sequence. The low-flow capping adhesive secures an optional cover (46) on the package to provide an environmental seal.

15 Claims, 2 Drawing Sheets

US 6,859,119 B2

MESO-MICROELECTROMECHANICAL SYSTEM PACKAGE

This invention was made with United States Government support under Agreement No. 70NANB0H3033 awarded by the National Institute of Standards and Technology (NIST). The United States Government has certain rights in the invention.

This invention was made with Government support under an award by DARPA. The U.S. Government has certain rights in this invention.

FIELD OF THE INVENTION

This invention relates generally to microelectromechanical devices. More particularly, this invention relates to packages for mesoscale microelectromechanical devices.

BACKGROUND OF THE INVENTION

Microelectromechanical systems (MEMS) are the integration of mechanical elements, sensors, actuators, and electronics on a substrate through micro fabrication technology. These devices, known as 'micro-machines' are manufactured using micro fabrication techniques. If microelectronic integrated circuits can be thought of as the "brains" of a system, then MEMS can be considered to be equivalent to the "eyes" and "arms", and together they create a complete microsystem to sense and control the environment. Sensors gather information from the environment through measuring mechanical, thermal, biological, chemical, optical, and magnetic phenomena. There are many MEMS devices, including accelerometers, gyroscopes, temperature sensors, chemical sensors, micro-lenses, comb drive actuators, piezoelectric actuators, blood analysis chips, genetic analysis chips, adaptive optics, arrayed fiber optic switch chips, automotive engine analysis sensor suites, and micro satellite components. Some of these devices were first realized as non-MEMS devices using traditional fabrication techniques many decades ago. The integrated circuits then process the information derived from the MEMS sensors and through some decision making capability direct the actuators to respond by moving, positioning, regulating, pumping, and filtering, thereby controlling the environment for some desired outcome or purpose. Because MEMS devices are manufactured using batch fabrication techniques similar to those used for integrated circuits, unprecedented levels of functionality, reliability, and sophistication can be placed on a small silicon chip at a relatively low cost.

Concerning the size definitions of these "small" devices, three categories are often used: meso, micro, and nano. Meso is a prefix meaning mid, medial, intermediate, or middle. Meso sized devices typically have feature sizes between 2 mm and 50 mm. Micro sized devices have feature sizes between 500 nm and 2 mm. Nano sized devices have feature sizes between 1 nm and 500 nm. Generically speaking, the term 'MEMS' is often used to describe devices with all three feature sizes. Traditionally, most MEMS devices have been realized in silicon based technology, largely borrowed from microelectronics technology. However, in recent years a variety of other materials have been used to create MEMS devices, including polymers, ceramic, gallium arsenide, silicon carbide, and plated metals. The micromechanical components are traditionally fabricated using compatible "micromachining" processes (typically based on chemical etching or machining) that selectively etch away parts of the silicon wafer or add new structural layers to form the mechanical and electromechanical devices. MEMS is an enabling technology allowing the development of smart products, augmenting the computational ability of microelectronics with the perception and control capabilities of microsensors and microactuators and expanding the space of possible designs and applications.

MEMS devices need to be packaged to protect them from environmental contamination and damage, and this is usually the most expensive and critical part of the silicon MEMS fabrication. In the field of meso-MEMS devices, packaging is equally important and costly. It would be a great addition to meso-MEMS technology if a cost effective package could be created.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

A mesoscale microelectromechanical system (MEMS) package for a micro-machine. The mesoscale micromachine is formed on a printed circuit board at the same time and of the same materials as the package that will contain the mesoscale micro-machine. Both the micro-machine and the package have at least a first metal layer, an insulating member formed on the first metal layer, and a second metal layer situated on the insulating layer. The package consists of at least a perimeter wall surrounding the micro-machine and a capping adhesive layer on top of the perimeter wall. The first metal layers of both the micro-machine and the package are formed in the same process sequence, and the insulating layers of both the micro-machine and the package are formed in the same process sequence, and the second metal layers of both the micro-machine and the package are formed in the same process sequence. The low-flow capping adhesive secures an optional cover on the package to provide an environmental seal.

Figure 1:
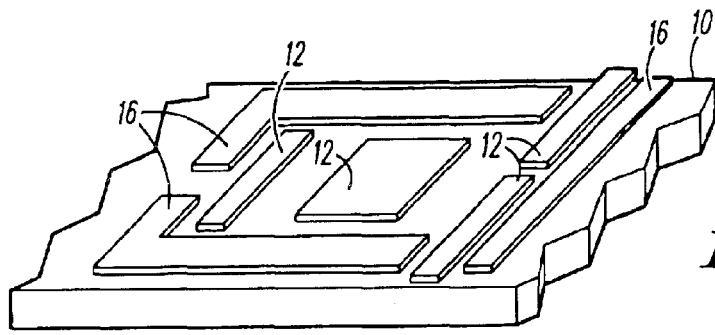
FIG. 1 is an isometric view of a first metal layer of a meso-MEMS package in accordance with certain embodiments of the present invention.

While this invention is susceptible of embodiment in many different forms, there is shown in the drawings and will herein be described in detail specific embodiments, with the understanding that the present disclosure is to be considered an example of the principles of the invention and not intended to limit the invention to the specific embodiments shown and described. In the description below, like reference numerals are used to describe the same, similar or corresponding elements in the several views of the drawings. Referring now to FIG. 1, a mesoscale microelectromechanical machine and a package therefore is formed on an organic substrate 10, such as a printed circuit board or other suitable polymer such as polyetherimide, polyimide, polyester, polyamide, polytetraflouroethylene or combinations of these. The package for the mesoscale, is formed at the same time and using the same steps as the mesoscale microelectromechanical machine itself, that is to say, the package is formed in situ. For purposes of illustration, the process employed when fabricating a meso-MEMS and it's package on a printed circuit board (PCB) will be described, but it is understood that this is offered as an example of the principles of the invention and is not intended to limit the invention to the specific embodiment shown. Typically, the printed circuit board 10 contains a layer of copper that is bonded or clad to one or both surfaces. The copper is delineated in conventional manner to form various portions of the first metal layer 12 of the mesoscale microelectromechanical machine, and at the same time, the first metal layer 16 of the package walls is delineated. One of ordinary skill in the art will appreciate that these various copper features 12, 16 on the PCB are delineated by employing a number of process steps such as masking, imaging, developing, etching and stripping the mask. These individual steps are typically arranged in a particular order and happen one after another and are collectively known as a process sequence. Additionally, there are various electrical interconnections that will not be shown (in order to simplify the drawings) that serve to electrically connect the various portions of the micromachine to appropriate control circuitry. Next, in FIG. 2, an insulating layer 20 is formed so that one or more portions 22 covers at least a portion of the first metal layer 12 of the mesoscale microelectromechanieal machine, and so that one or more portions 26 covers at least a portion of the first metal layer 16 of the package walls. At this point it should be obvious to the astute reader that we are building up the mesoscale microelectromechanical machine at the same time that we are building up the perimeter walls for the package that will enclose the mesoscale microelectromechanical machine. The insulating layer 20 can be a variety of materials, such as photoresist, but typically is a more robust material such as those that are used in the well known high density interconnect (HDI) circuits formed on a PCB, for instance, a polyimide or epoxy, conventional or photoimageable. And, as explained above, the deposition of the insulating layer and formation of the various features will generally require a number of individual process steps, which taken together, comprise a second process sequence. Some portions 22 of this insulating layer 20 will ultimately remain to become a permanent part of the micromachine, and other portions 22a are intended to be a temporary sacrificial layer and will ultimately be removed. On top of that layer, a second metal layer is created as depicted in FIG. 3. This second metal layer 30 is typically electroplated copper that is delineated in conventional manner to form specific features 32, such as a beam, of the mesoscale microelectromechanical machine. Although FIG. 3 depicts the portion 32 of the second metal layer as being deposited directly on the insulating layer 22, it should be clear to one of ordinary skill in the art of MEMS that the practitioner is free to create numerous options in order to create the desired sensor, and so, for example, one might also find that portions of the second metal layer 30 could be formed directly on certain selected portions 12 of the first metal layer 10. FIG. 3 depicts a "post and beam" structure where the post 22 formed in FIG. 2 supports a portion of the cantilever beam 32 shown in FIG. 3, and the temporary structure 22a, shown in dashed lines, is removed to leave the right end of beam 32 suspended to function as an actuator. In addition, an additional portion 36 of the package wall is created at the same time and in the same sequence. That is to say, a layer of the package wall is created simultaneously when the second metal layer of the micromachine is formed. One of ordinary skill in the art will appreciate that copper features on a PCB are delineated by employing a number of process steps such as masking, imaging, developing, etching and stripping the mask. Optionally, one could add or substitute other metals, such as nickel, gold, tin, etc., in place of copper, if desired.

Figure 2:
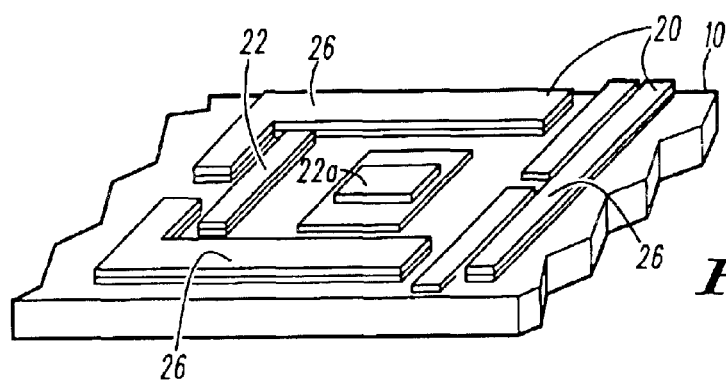
FIG. 2 is an isometric view of FIG. 1 with the addition of a first insulating layer of a meso-MEMS package in accordance with certain embodiments of the present invention.
Figure 3:
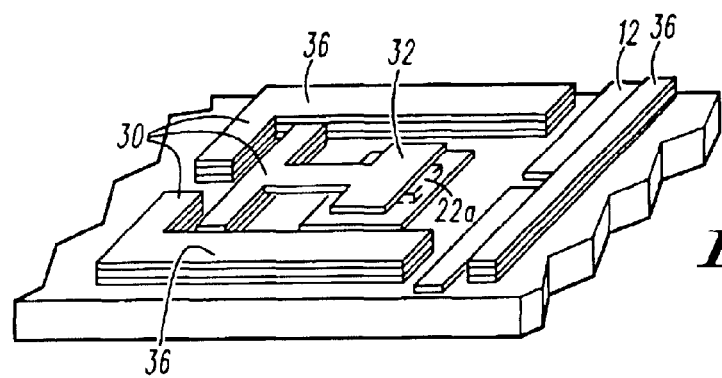
FIG. 3 is an isometric view of FIG. 2 with the addition of a second metal layer of a meso-MEMS package in accordance with certain embodiments of the present invention.
Figure 4:
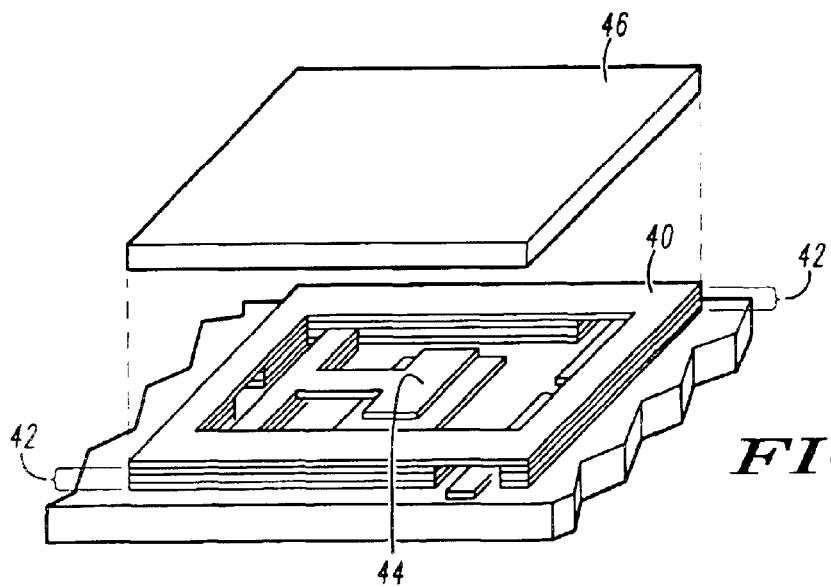
FIG. 4 is an isometric view of FIG. 3 with the addition of an adhesive polymer layer of a meso-MEMS package in accordance with certain embodiments of the present invention.

In an alternate embodiment, one can repeat the steps shown in FIGS. 2 and 3 one or more times to form more intricate and sophisticated systems, if desired. Again, one of ordinary skill in the art will appreciate that iterating the process to deposit additional layers of insulator and/or metal will create larger and more complicated micromachines. However, the key is to continue creating additional layers of the package wall during these iterations, so that the package walls grow in height commensurately. Referring now to FIG. 4, a polymer layer having adhesive properties 40 lies on top of the last layer of the multilayer package wall 42 that was formed above. This adhesive material 40 plays a key role in the invention, as it enables the bonding of a cover or cap over the micromachine to complete the package and isolate it from the environment. The adhesive material 40 adds an additional layer to the package wall 42, which makes it higher than the highest portion 44 of the micromachine within the walls, thus providing clearance for the cover 46. In our preferred embodiment, a B-stage adhesive, such as a low-flow or no-flow prepreg of epoxy impregnated fiberglass, is employed as the polymer layer having adhesive properties 40. Three such suitable materials are No-Flo A11 from Isola, N5000-30NF from Nelco, and NVF ML-900-80NF from Nelco. Low-flow or no-flow adhesives are generally considered to be adhesives that exhibit minimal or no significant flowout when heated in the curing cycle One of ordinary skill in the art understands that a B-stage adhesive is a thermosetting adhesive that is at an intermediate stage in reaction in which the polymer softens but does not fuse when heated, and swells but does not dissolve in contact with certain solvents. Generally speaking, we find that low-flow or no-flow adhesives are preferred, but if the micromachine and the accompanying package are designed to accommodate it, then one can employ an adhesive that flows upon heating, however this is not recommended. Additionally, the adhesive could be other derivatives of epoxy and other reinforcing materials can be used, such as carbon fibers, titanium dioxide, glass microballoons, etc. Further, one can use polymers that soften upon heating to form a serviceable bond to the cover 46, such as polyimides, polyesters, polyamides, etc. In that instance, the cover 46, such as a metal or polymer sheet, is bonded to the polymer by heat and pressure.

Figure 5:
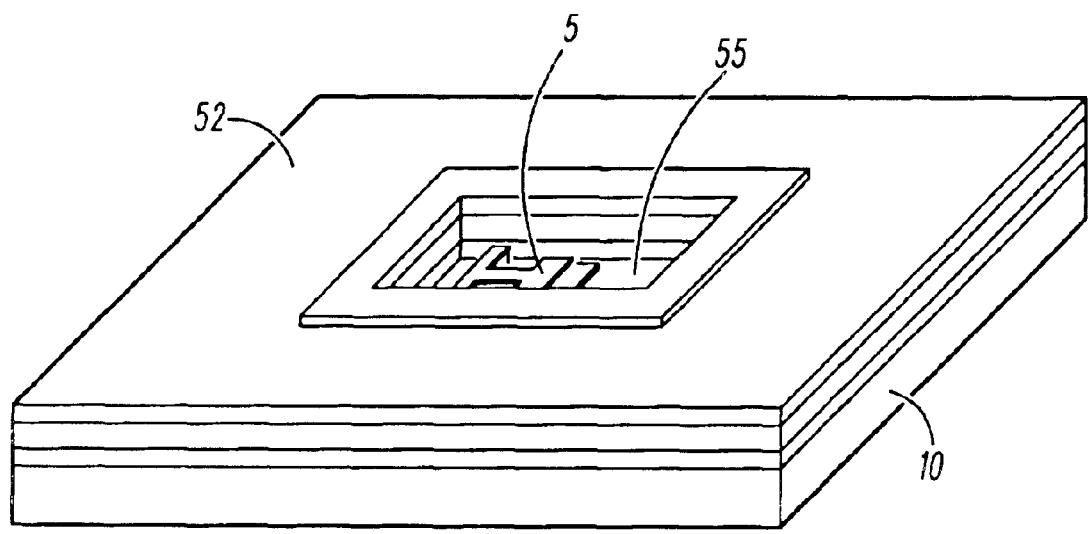
FIG. 5 is an isometric view of a meso-MEMS package in accordance with certain embodiments of the present invention.

While the figures depict the package wall in the form of a three dimensional picture frame structure, this should not be limiting since there are alternate embodiments contemplated. For example, one can follow the same process as described above, but instead of creating a narrow package wall, the package wall 52 as shown in FIG. 5 is extremely wide, nearly as large as the substrate 10 itself, in essence creating a thicker PCB having a cavity 55 that contains the micromachine 5. Another embodiment envisions that an array of the MEMS packages are formed as described in our preferred embodiment, except that the cover is not put in place, and then the individual MEMS packages are singulated out of the array, and each individual MEMS package is placed on another substrate (such as a mother board PCB) upside down, so that the micromachine faces the mother board and the adhesive then bonds the package to the surface of the motherboard. Thus, the motherboard serves as the sixth side of the package to form the environmental seal. Other variations will occur to those skilled in the art upon consideration of the teachings herein. For example, the order of certain operations carried out can often be varied, additional operations can be added or operations can be deleted without departing from the invention. Such variations are contemplated and considered equivalent.

While the invention has been described in conjunction with specific embodiments, it is evident that many alternatives, modifications, permutations and variations will become apparent to those of ordinary skill in the art in light of the foregoing description. For example, we contemplate that our invention can be utilized to create a novel radio frequency (RF) switch. Accordingly, it is intended that the present invention embrace all such alternatives, modifications and variations as fall within the scope of the appended claims.

What is claimed is:

1. A mesoscale microelectromechanical system package, comprising:
   a microelectromechanical machine situated on an organic substrate, said microelectromechanical machine having a first metal member delineated directly on said substrate in a first process sequence, and having an insulating member formed at least partially on said first metal member in a second process sequence, and having a second metal member situated at least partially on said insulating member in a third process sequence;
   a perimeter wall substantially surrounding said microelectromechanical machine, said perimeter wall having a first metal layer formed directly on said substrate, and having an insulating layer situated on said first metal layer, and having a second metal layer situated on said insulating layer, and having a polymer layer having adhesive properties situated on at least a portion of an upper surface of said perimeter wall; and
   wherein said first metal member and said first metal layer are formed in said first process sequence, and wherein said insulating member and said insulating layer are formed in said second process sequence, and wherein said second metal member and said second metal layer are formed in said third process sequence.

2. The mesoscale microelectromechanical system package as described in claim 1, wherein said perimeter wall comprises a picture frame structure, said structure having a first side wall facing said micromechanical machine, a second side wall substantially parallel to said first side wall and situated away from said first side wall, and a horizontal surface connecting a top portion of each of said first and second side walls together.

3. The mesoscale microelectromechanical system package as described in claim 1, wherein said perimeter wall comprises a cavity on said organic substrate.

4. The mesoscale microelectromechanical system package as described in claim 1, wherein said perimeter wall comprises a laminar structure.

5. The mesoscale microelectromechanical system package as described in claim 1, further comprising a cover attached to said polymer layer for sealing said package.

6. The mesoscale microelectromechanical system package as described in claim 1, wherein said polymer layer comprises an epoxy adhesive.

7. A mesoscale microelectromechanical system package, comprising:
   a microelectromechanical machine situated on a printed circuit board, said microelectromechanical machine having a first copper member delineated directly on said printed circuit board in a first process sequence, and having a polymer member formed at least partially on said first metal member in a second process sequence, and having a second metal member situated at least partially on said insulating member in a third process sequence;
   a perimeter picture frame structure substantially surrounding said microelectromechanical machine, comprising a first side wall facing said micromechanical machine, a second side wall substantially parallel to said first side wall and situated away from said first side wall, and a horizontal surface connecting a top portion of each of said first and second side walls together;
   said perimeter picture frame structure comprising a first copper layer formed directly on said printed circuit board, and having a polymer layer situated on said first copper layer, and having a second metal layer situated on said polymer layer, and having a polymer layer having adhesive properties situated on at least a portion of an upper surface of said perimeter wall; and
   wherein said first copper member and said first copper layer are formed in said first process sequence, and wherein said polymer member and said polymer layer are formed in said second process sequence, and wherein said second metal member and said second metal layer are formed in said third process sequence.

8. The mesoscale microelectromechanical system package as described in claim 7, wherein said perimeter wall comprises a laminar structure.

9. The mesoscale microelectromechanical system package as described in claim 7, further comprising a cover attached to said polymer layer for sealing said package.

10. The mesoscale microelectromechanical system package as described in claim 7, wherein said polymer layer having adhesive properties comprises a low-flow adhesive or a no-flow adhesive.

11. A microelectromechanical RF switch package, comprising:
    a microelectromechanical RF switch situated on an organic substrate, said microelectromechanical RF switch comprising a first metal member delineated directly on said substrate in a first process sequence, and comprising an insulating member formed at least partially on said first metal member in a second process sequence, and comprising a second metal member situated at least partially on said insulating member in a third process sequence;
    a perimeter wall substantially surrounding said microelectromechanical RF switch, said perimeter wall comprising a first metal layer formed directly on said substrate, and comprising an insulating layer situated on said first metal layer, and comprising a second metal layer situated on said insulating layer, and comprising a polymer layer having adhesive properties situated on at least a portion of an upper surface of said perimeter wall; and
    wherein said first metal member and said first metal layer are formed in said first process sequence, and wherein said insulating member and said insulating layer are formed in said second process sequence, and wherein said second metal member and said second metal layer are formed in said third process sequence.

12. The microelectromechanical RF switch package as described in claim 11, wherein said perimeter wall comprises a picture frame structure, said structure having a first side wall facing said micromechanical machine, a second side wall substantially parallel to said first side wall and situated away from said first side wall, and a horizontal surface connecting a top portion of each of said first and second side walls together.

13. The microelectromechanical RF switch package as described in claim 11, wherein said perimeter wall comprises a cavity on said organic substrate.

14. The microelectromechanical RF switch package as described in claim 11, wherein said perimeter wall comprises a laminar structure.

15. The microelectromechanical RF switch package as described in claim 11, further comprising a cover attached to said adhesive layer for sealing said package.

* * * * *